United States Patent
Kuriyama et al.

(10) Patent No.: US 6,262,916 B1
(45) Date of Patent: Jul. 17, 2001

(54) NON-VOLATILE SEMICONDUCTOR MEMORY DEVICE CAPABLE OF PRE-CONDITIONING MEMORY CELLS PRIOR TO A DATA ERASURE

(75) Inventors: Masao Kuriyama, Fujisawa; Hidetoshi Saito, Yokohama; Tadayuki Taura, Zushi, all of (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/491,019

(22) Filed: Jan. 25, 2000

Related U.S. Application Data

(63) Continuation of application No. 09/233,855, filed on Jan. 19, 1999, now Pat. No. 6,078,525.

(30) Foreign Application Priority Data

Jan. 20, 1998 (JP) ................................................. 10-008592

(51) Int. Cl.$^7$ .................................................... G11C 16/34
(52) U.S. Cl. ................. 365/185.24; 365/185.22; 365/185.09; 365/236; 365/189.07; 365/225.7; 365/195
(58) Field of Search ...................... 365/185.24, 185.09, 365/185.22, 236, 189.07, 225.7, 195

(56) References Cited

U.S. PATENT DOCUMENTS

| | | | |
|---|---|---|---|
| 5,721,701 | * 2/1998 | Ikebe et al. | 365/185.03 |
| 5,754,558 | 5/1998 | Hayakawa et al. | 714/721 |
| 5,835,413 | 11/1998 | Hurter et al. | 365/185.24 |

OTHER PUBLICATIONS

Seiji Yamada et al., "A Self–Convergence Erasing Scheme For a Simple Stacked Gate Flash Eeprom", IEEE Tech. Dig. IEDM 1991, pp. 307–310.*

* cited by examiner

Primary Examiner—Andrew Q. Tran
(74) Attorney, Agent, or Firm—Hogan & Hartson L.L.P.

(57) ABSTRACT

In a non-volatile semiconductor memory device, a binary counter is connected to a most significant bit portion of an address counter for successively generating addresses of rows of a memory cell array. The binary counter forcibly selects one of spare row lines, and permits a pre-program operation (program operation prior to data erasure) to be performed on memory cells connected to the selected one of spare row lines, when the pre-program operation has completely been performed on the memory cells of the rows of the memory cell array. In the pre-program operation, whether or not to verify data is determined on the basis of a coincidence signal outputted from a defective row address storing section.

19 Claims, 11 Drawing Sheets

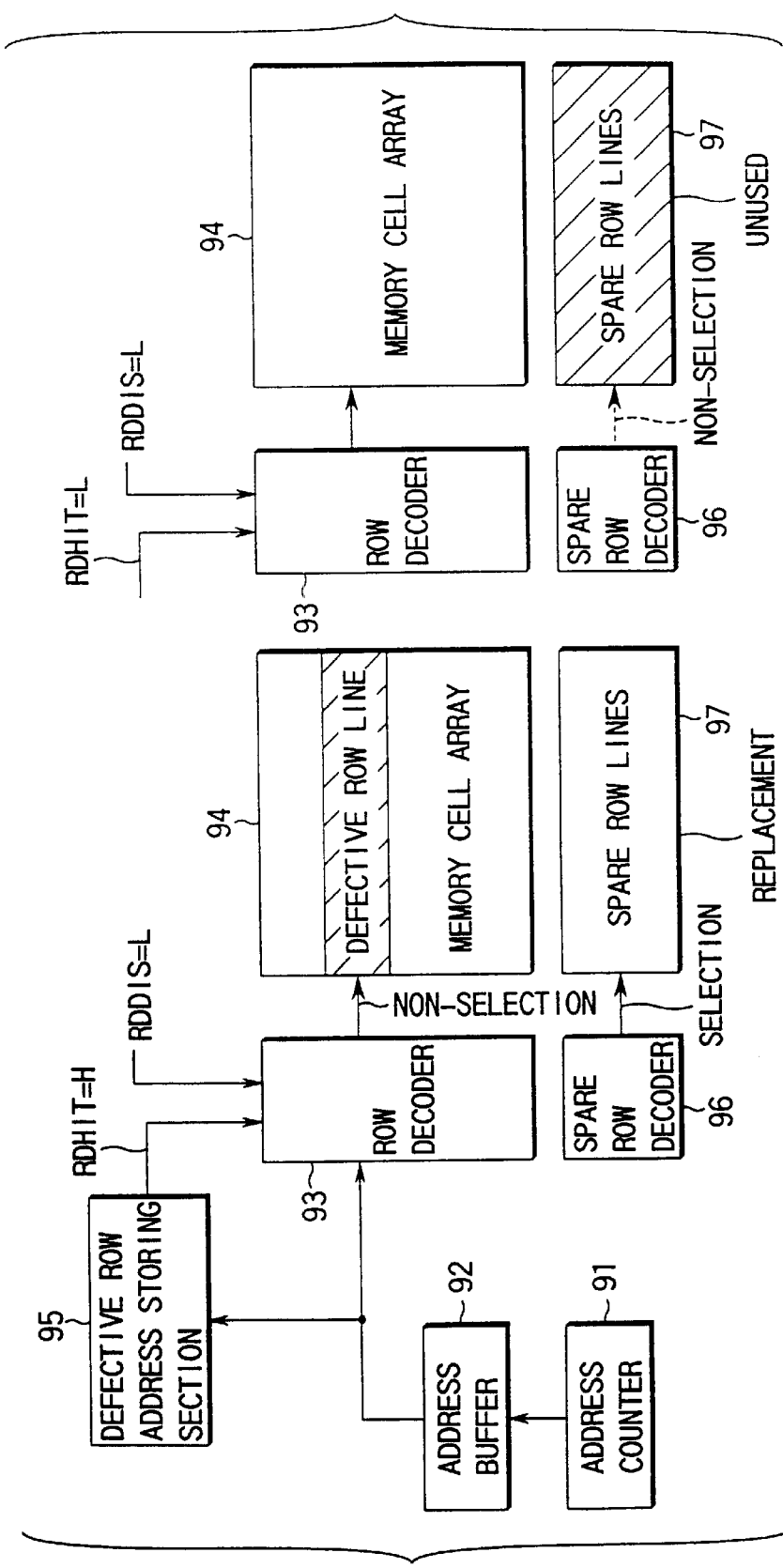

NON-VOLATILE SEMICONDUCTOR MEMORY DEVICE CAPABLE OF PRE-CONDITIONING MEMORY CELLS PRIOR TO A DATA ERASURE

This is a continuation of application Ser. No. 09/233,855 filed Jan. 19, 1999, now U.S. Pat. No. 6,078,525, which application is hereby incorporated by reference in its entirety.

BACKGROUND OF THE INVENTION

The present invention relates to an EEPROM or a flash EEPROM or the like, and in particular, a nonvolatile semiconductor memory device in which data is programmed before data erasure.

In general, a non-volatile semiconductor memory device such as an EPROM and a flash EEPROM has memory cells each of which comprises a transistor having a stacked gate structure in which a control gate is stacked on a floating gate. In order to program data in a flash EEPROM of, e.g., an NOR type memory cell array, a voltage for programming is applied across a control gate and a drain to generate channel hot electrons, and the hot electrons are injected into the floating gate.

In order to erase the data programmed in the memory cell, a high voltage is applied across the control gate and source, whereby electrons captured by the floating gate are discharged therefrom to the source due to a tunnel phenomenon.

The above data erasure has a problem of over-erase which causes that the threshold voltage of the memory cell becomes negative. To be more specific, if data its excessively erased from a memory cell (which is hereinafter referred to as an over-erase cell), the cell is in the ON-state even when it is not selected. Thus, if a memory cell which stores data "0" and is in the OFF state is connected to a bit line connected to an over-erase cell, even when the "0" data stored memory cell is selected, a correct data cannot be read out via the bit line.

In order to prevent the above over-erase in the flash memory, data erasure and a verify operation for the data erasure are repeatedly carried out, and the data erasure is ended when the threshold voltage of the one of the memory cells which requires the longest time period for data erasure lowers to a predetermined voltage. Such operations are executed by an automatic erasure control section provided in the semiconductor memory chip.

However, in the flash EEPROM, the variation of the threshold voltages of the memory cells is 2V or more and considerably great, as compared with data erasure using ultraviolet rays, in which the variation of the threshold voltages of the memory cells falls within the range of 1V or less. Thus, the lower limit of the program voltage is restricted.

In view of the above, in order to reduce the variation of the threshold voltages after data erasure, the following pre-program operation (a program operation prior to data erasure) is performed: data is programmed in all the memory cells of the memory cell array of the flash EEPROM before application of an erase voltage, whereby electrons are injected into the floating gates of all the memory cells. The preprogram operation is controlled by the automatic data erasure control section provided in the semiconductor memory chip. To be more specific, in the pre-program operation, data is fixed at "0", and then is programmed in memory cells in units of one memory cell block, while changing the addresses of the memory cell blocks.

Conventionally, the following two methods have been proposed as the pre-program operations:

In the first method, the program operation is performed regardless of the data stored the memory cells in the memory cell array. To be more specific, as shown in FIG. 7, data "0" is programmed in all the memory cells, while incrementing the addresses of the memory cells. In this method, the program operation is performed for a time period in which the threshold voltages of the memory cells will be sufficiently increased, while without verifying the threshold voltages of the memory cells. Thus, in the pre-program operation according to the first method, there is a possibility that electrons may excessively be injected into the floating gates of the memory cells.

In the second method, the data stored in the memory cells of the memory cell array is checked, and the program operation is performed only on a memory cell the threshold voltage of which is low. In this case, before the program operation, the threshold voltages of the memory cells, as shown in FIG. 8, are verified (ST71, ST72), and data is programmed only in the memory cell the threshold voltage of which is low (ST73, ST74). Thereafter, data programming is verified, and if it is verified that the data programming is insufficient, the program operation is re-performed. This operation is performed on all the memory cells, while incrementing the addresses of the memory cells. Therefore, according to the second method, the threshold voltages of all the memory cells can be set at the same value.

If spare row lines to be used for defective row lines are provided in the memory cell array, the preprogram operation is performed on the memory cell of the defective row lines and the memory cells of the spare row lines, in order to prevent over-erase from occurring in those memory cells.

However, if a defective memory cell is present, in which the floating gate and the control gate short-circuit, the defective memory cell does not enter the OFF state; it is always in the ON state, even after the program operation is performed. Thus, when a sequential operation, as shown in FIG. 8, including a verify operation is performed on the defective memory cell, it is not finished since the threshold voltage of the defective memory cell is not increased. Therefore, the pre-program operation performed on the defective memory cell must not be verified.

In a conventional flash EEPROM, the pre-program operation and the verify operation, both shown in FIG. 8, are performed as illustrated in FIGS. 9A, 9B, 10A, 10B, and 11. Specifically, in units of one row line, the data of memory cells is successively verified, and data is programmed in the memory cells. If an address of a defective row line is hit, the data of memory cells connected to a spare row line replaced by the defective row line is verified, and data is programmed in the memory cells of the spare row line. To be more specific, as shown in FIG. 9A, row lines in a memory cell array 94 are successively selected in accordance with the operation of an address counter 91, an address buffer 92 and a row address decoder 93, and data of memory cells connected to the selected row lines is verified (steps ST101 and ST102 in FIG. 11). Based on the verification result, data "0" is set and programmed in those of the memory cells of the selected row line, the threshold voltages of which are low (steps ST104 to ST107 in FIG. 11).

If a defective row line is designated, a replacing signal RDHIT outputted from a defective row address storing section 95 including fuses (not shown) rises to a high level "H". As a result, a spare row decoder 96, instead of a row decoder 93, selects a spare row line 97. In this state, the data of memory cells connected to the spare row line 97 is verified, and then data is programmed in the memory cells. Here, the row decoder 93 receives a replacement prohibiting signal RDDIS having a low level "L".

In this case, the defective row line is not selected, and thus neither the verify operation nor the program operation is performed on the memory cells of the defective row line. If the memory cell array 94 include no defective row line, the spare row line 97 is not selected. In other words, the spare row line 97 is not used (See FIG. 9B).

After completing programming processing of the memory cells connected to the last one of the row lines in the memory cell array 94, the program operation is performed on memory cells of the defective row line and memory cells connected to the spare row line. When the memory cell array 94 includes a defective row line, the address of the defective row line, as shown in FIG. 10A, is read out from the defective row address storing section 95, and is supplied to an address buffers 92 (ST108). At the same time, a spare use signal SPE outputted from the defective row address storing section 95 is set at a high level, and the replacement prohibiting signal RDDIS is set at a high level, thereby selecting the defective row line. In this state, the program operation is performed on the memory cells of the defective row line, without performing the verify operation (ST109 to ST112).

On the other hand, when no defective row line is included in the memory cell array 94, the spare use signal SPE outputted from the defective row address storing section 95 is set at a low level. Thus, as shown in FIG. 10B, a unused spare row line is forcibly selected (ST109, ST113). In this state, data is programmed in memory cells connected to the selected spare row line without performing the verify operation (ST111, ST112).

However, the above pre-program operation includes a sequential operation specific for the defective row line, and as a result, an automatic data erasing circuit is complicated. Furthermore, it is necessary to read out the address of the defective row line from the defective row address storing section 95, and feed back the defective row address to the address buffer 92. Thus, the circuit structure is also complicated.

Specifically, the defective row address storing section 95, as shown in FIG. 12, needs to have a defective row address storing element 95a comprising, e.g., fuses (not shown) for storing the address of a defective row line, a coincidence detecting circuit 95b for comparing an input row address with the address of the defective row line, a buffer circuit 95e connected to an output terminal of the coincidence detecting circuit 95b, for outputting a coincidence signal RDHIT, a buffer circuit 95c connected to the defective row address storing element 95a, for outputting a spare use signal SPE, and a buffer circuit 95d connected to the defective row address storing element 95a, for reading out the address of the defective row line, and feeding back the address to the address buffer. In such a manner, the circuit structure and the layout of structural element are complicated.

BRIEF SUMMARY OF THE INVENTION

The present invention has been made in order to solve the above problem, and its object is to provide a non-volatile semiconductor memory device in which the circuit structure and the layout of structural elements are not complicated, and control of a pre-program operation (program operation prior to data erasure) is simple.

In order to attain the above object, a nonvolatile semiconductor memory device according to a first aspect of the present invention comprises:
a memory cell array having a plurality of row lines;
spare row lines each of which being used instead of a defective one of the row lines of the memory cell array;
a counter for successively generating signals for use in selection of the row lines of the memory cell array at pre-program operation;
a row decoder for selecting one of the row lines of memory cell array in response to a respective one of the signals generated by the counter;
a defective row address storing circuit for storing addresses of the defective row lines, and for generating a coincidence signal when an address of one of the row lines of the memory cell array which is selected by the row decoder is identical to one of the addresses stored in the defective row address storing circuit;
a spare decoder for selecting one of the spare row lines which is to be used instead of the one defective row line;
a signal generating circuit for generating a control signal for use in allowing selection of the spare row lines and prohibiting selection of the row lines of the memory cell array, after the counter generates a signal for use in selecting a last one of the row lines of the memory cell array;
a control circuit for controlling programming of data in such a manner that programming of data is first performed on memory cells connected to the row lines of the memory cell array and programming of data is thereafter performed on memory cells connected to the spare row lines, in response to the signal generated by the counter at the pre-program operation, the control signal outputted from signal generating circuit, and the coincidence signal outputted from the defective row address storing circuit.

In the non-volatile semiconductor memory device according to the first aspect of the present invention, the signal generating circuit may comprise a binary counter connected to a high order bit portion of the counter.

In the non-volatile semiconductor memory device according to the first aspect of the present invention,
the control circuit may verify data of those memory cells of the memory cells connected to the row lines of the memory cell array which are non-defective and then may program data in the non-defective memory cells when verifying that data programming of the non-defective memory cells is insufficient, in response to the control signal outputted from the signal generating circuit and the coincidence signal outputted from the defective row address storing circuit; the control circuit may program data in memory cells connected to the defective row lines without verifying data of the memory cells connected to the defective row lines, in response to the control signal outputted from the signal generating circuit and the coincidence signal outputted from the defective row address storing circuit, and the control circuit may program data in the memory cells connected to the spare row lines, without verifying data of the memory cells connected to the spare row lines, in response to the control signal outputted from the signal generating circuit and the coincidence signal outputted from the defective row address storing circuit.

In the non-volatile semiconductor memory device according to the first aspect of the present invention, the control circuit may verify data of those memory cells of the memory cells connected to the row lines of the memory cell array which are non-defective and then may program data in the non-defective memory cells when verifying that data programming of the non-defective memory cells is insufficient, in response to the control signal outputted from the signal generating circuit and the coincidence signal outputted from the defective row address storing circuit; the control circuit may program data in memory cells connected to the defective row lines without verifying data of the memory cells connected to the defective row lines, in response to the control signal outputted from the signal generating circuit and the coincidence signal outputted from the defective row address storing circuit, and the control circuit may program data in the memory cells connected to the spare row lines, while verifying data of the memory cells connected to the spare row lines, in response to the control signal outputted from the signal generating circuit and the coincidence signal outputted from the defective row address storing circuit.

In the non-volatile semiconductor memory device according to the first aspect of the present invention, in a case where the control circuit performs a verify operation for verifying data of the memory cells of the defective row lines, and a program operation for programming data in the memory cells of the defective row lines, the control circuit may set all verify data at "1" when performing the verify operation for a first time, and may set all the verify data at "0" when performing the verify operation for a second time.

In the non-volatile semiconductor memory device according to the first aspect of the present invention, the control circuit may program data at "0" in the memory cells of the defective row lines without verifying data of the memory cells of the defective row lines.

In the non-volatile semiconductor memory device according to the first aspect of the present invention, in a case where the control circuit performs a verify operation for verifying data of the memory cells connected to the spare row lines, and a program operation for programming data in the memory cells connected to the spare row lines, if the spare row lines is unused, the control circuit may set all verify data at "1" when performing the verify operation for a first time, and may set all the verify data at "0" when performing the verify operation for a second time.

In the non-volatile semiconductor memory device according to the first aspect of the present invention, in a case where the control circuit performs a program operation for programming data in the memory cells connected to the spare row lines, if the spare row lines are unused, the control circuit may program data "0" in the memory cells connected to the spare row lines without verifying data of the memory cells connected to the spare row lines.

In the non-volatile semiconductor memory device according to the first aspect of the present invention, in a pre-program operation in which the program operation prior to data erasure is performed, the control circuit may prohibit any of the spare row lines from being used instead of the defective row lines.

A non-volatile semiconductor memory device according to a second aspect of the present invention comprises:

a memory cell array having a plurality of row lines;

spare row lines each of which being used instead of a defective one of the row lines of the memory cell array;

a counter circuit for successively generating signals for use in selection of the row lines of the memory cell array and he spare row lines at pre-program operation;

a row decoder for selecting one of the row lines of memory cell array in response to a respective one of the signals generated by the counter circuit;

a defective row address storing circuit for storing addresses of the defective row lines which have been replaced to the spare row lines, and for generating a coincidence signal when an address of one of the row lines of the memory cell array which is selected by the row decoder is identical to one of the addresses stored in the defective row address storing circuit;

a spare row decoder for selecting one of the spare row lines in response to the signals outputted from the counter circuit;

a signal generating circuit for generating a control signal for use in allowing selection of the spare row lines and prohibiting selection of the row lines of the memory cell array, after the counter generates a signal for use in selecting a last one of the row lines of the memory cell array;

a control circuit for controlling programming of data in such a manner that programming of data is first performed on memory cells connected to the row lines of the memory cell array and programming of data is thereafter performed on memory cells connected to the spare row lines, in response to the signal generated by the counter at the pre-program operation, the control signal outputted from signal generating circuit, and the coincidence signal outputted from the defective row address storing circuit.

In the non-volatile semiconductor memory device according to the second aspect of the present invention, the counter circuit may be such that the number of bit of which is larger than the number of the row address of the memory cell array.

In the non-volatile semiconductor memory device according to the second aspect of the present invention, the counter circuit may be such that the number of bits of which is equal to a total number of the spare row address and the row address of the memory cell array.

In the non-volatile semiconductor memory device according to the second aspect of the present invention, in a case where the control circuit performs a verify operation for verifying data of the memory cells of the defective row lines, and a program operation for programming data in the memory cells of the defective row lines, the control circuit may set all verify data at "1" when performing the verify operation for a first time, and may set all the verify data at "0" when performing the verify operation for a second time.

In the non-volatile semiconductor memory device according to the second aspect of the present invention, the control circuit may program data "0" in the memory cells of the defective row lines without verifying data of the memory cells of the defective row lines.

In the non-volatile semiconductor memory device according to the second aspect of the present invention, in a case where the control circuit performs a verify operation for verifying data of the memory cells connected to the spare row lines, and a program operation for programming data in the memory cells connected to the spare row lines, if the spare row lines is unused, the control circuit may set all verify data at "1" when performing the verify operation for a first time, and may set all the verify data at "0" when performing the verify operation for a second time.

In the non-volatile semiconductor memory device according to the second aspect of the present invention, in a case where the control circuit performs a program operation for programming data in the memory cells connected to the spare row lines, if the spare row lines are unused, the control circuit may program data "0" in the memory cells connected to the spare row lines without verifying data of the memory cells connected to the spare row lines.

In the non-volatile semiconductor memory device according to the second aspect of the present invention, in a pre-program operation in which the program operation prior to data erasure is performed, the control circuit may prohibit any of the spare row lines from being used instead of the defective row lines.

A non-volatile semiconductor memory device according to a third aspect of the present invention comprises:

a memory cell array having a plurality of row lines;

spare row lines provided separate from the memory cell array so that when the memory cell array includes a defective memory cell, a selected one of the spare row lines is used instead of one of the row lines which is connected to the defective memory cell;

a counter circuit for successively generating signals for use in selection of the row lines of the memory cell array and the spare row lines, respectively, at pre-program operation in which a program operation prior to data erasure is performed;

a row decoder for selecting one of the row lines of memory cell array in response to a respective one of the signals generated by the counter circuit; and a spare row decoder for selecting the one of the spare row lines in response to a respective one of the signals generated by the counter circuit, wherein the counter circuit is such that the number of bits of which is equal to a total number of the spare row lines and the row lines of the memory cell array, programming of data is controlled in such a manner that programming of data is first performed on memory cells connected to the row lines of the memory cell array, and thereafter programming of data is performed on memory cells connected to the one of the spare row lines, in response to the signal generated by the counter circuit at the pre-program operation.

In the non-volatile semiconductor memory device according to the third aspect of the present invention, the non-volatile semiconductor memory device may further comprise a defective row address storing circuit for storing addresses of the defective row lines, when the spare row lines are used instead of the row lines of the memory cell array.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 9A is a schematic block diagram for illustrating the conventional pre-program operation of a non-volatile semiconductor memory device.

FIG. 9B is another schematic block diagram for illustrating the conventional pre-program operation of a non-volatile semiconductor memory device.

DETAILED DESCRIPTION OF THE INVENTION

An embodiment of the present invention will be explained with reference to the accompanying drawings.

Figure 1:
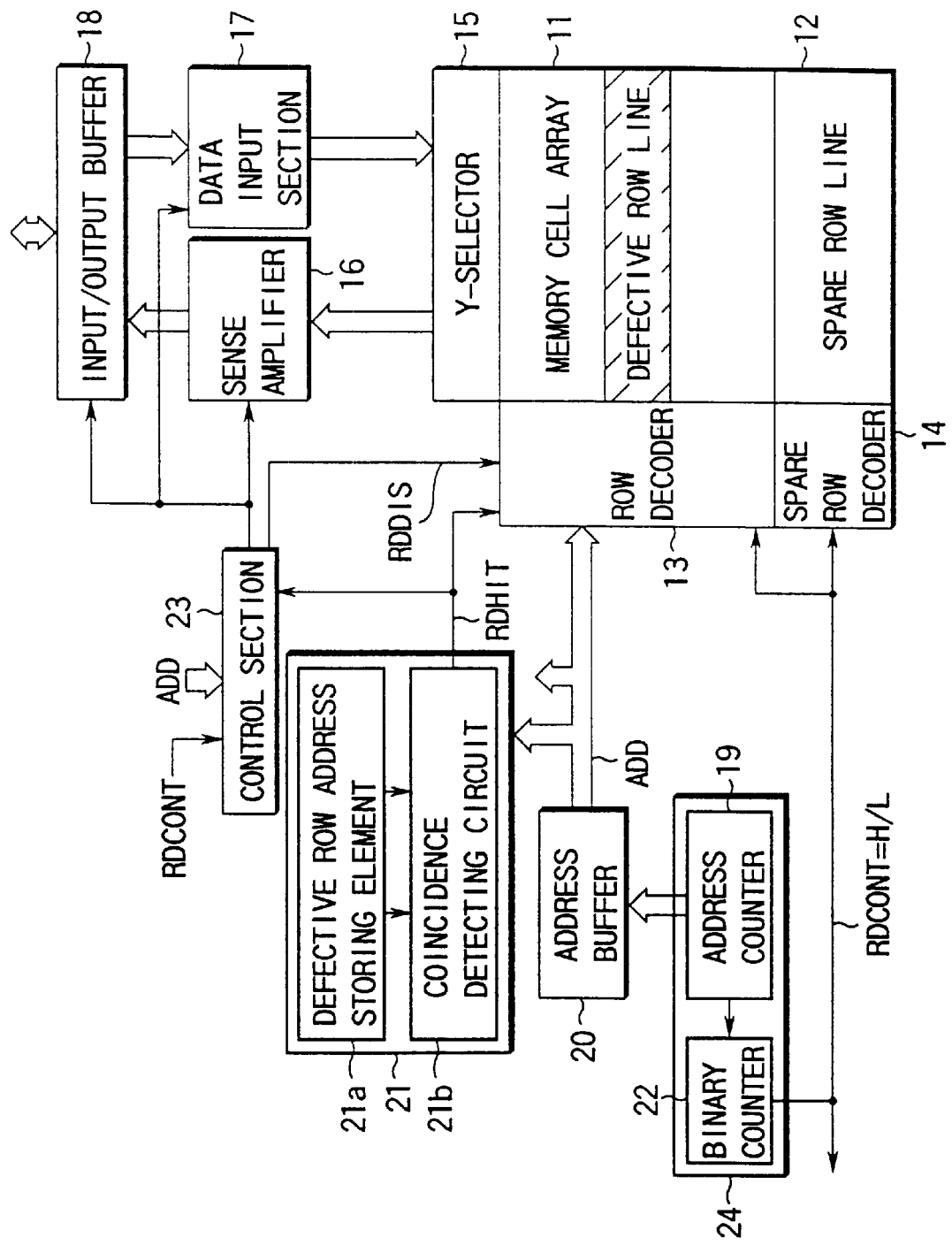
FIG. 1 is a block diagram of a non-volatile semiconductor memory device according to an embodiment of the present invention.

FIG. 1 shows an example of a non-volatile semiconductor memory device according to the present invention. In the non-volatile semiconductor memory device, a memory cell array 11 comprises, e.g., NOR type EEPROM cells connected to a plurality of row and column lines. Furthermore, spare row lines 12 are provided, and each of the spare row lines can be used instead of a defective row line connected to a defective memory cell. The memory cell array 11 is connected to a row decoder 13 for selecting one of the row lines, and the spare row lines 12 are connected to a spare row decoder 14 for selecting one of the spare row lines 12. Furthermore, the memory cell array 11 is connected to a Y selector 15 for selecting one of the column lines.

A sense amplifier 16 and a data input section 17 are connected to the Y selector 15. At a data access time when data is read out, the sense amplifier 16 senses the data which is read out from a memory cell selected by the row decoder 13 and the Y selector 15, and is outputted from the Y selector 15. Then, the sense amplifier 16 amplifies the data, and supplies it to an input/output buffer 18. The data input section 17 supplies the data supplied from the input/output buffer 18 to the Y selector 15 at a data programming time when data is programmed. The supplied data is programmed in the memory cell selected by the row decoder 13 and the Y selector 15.

On the other hand, an address counter 19 successively produces the addresses of the memory cells in the memory cell array 11 at pre-program operation when a pre-program operation (program operation prior to data erasure) is performed. The addresses produced by the address counter 19 are supplied to the row decoder 13 through an address buffer 20, and are also supplied to a defective row address storing section 21 and a control section 23. The defective row address storing section 21 comprises a defective row address storing element 21a and a coincidence detecting circuit 21b. The defective row address storing element 21a comprises, e.g., fuses, and stores the address of a defective row line. The coincidence detecting circuit 21b outputs a replacement signal RDHIT having a high level, when the address of the defective row line, stored in the defective row address storing element 21a, is identical to the address represented by an address signal supplied from the address buffer 20. The replacement signal RDHIT is supplied to the row decoder 13 and the control section 23.

A binary counter 22, for example, a 1 bit binary counter, is connected to a most significant bit portion of the address counter 19. The binary counter 22 and the address counter 19 constitute a counter circuit 24. The binary counter 22 serves as a signal generating circuit, which generates a signal RDCONT having a high level when the address counter 19 generates the addresses of all the row lines in the memory cell array 11. The signal RDCONT is supplied to the spare row decoder 14 and the row decoder 13. The signal RDCONT is also supplied to the control section 23. When receiving the signal RDCONT, the row decoder 13 enters a selection prohibiting state wherein the row decoder 13 is prohibited from selecting a row line. When receiving the signal RDCONT, the spare row decoder 14 enters a selection state wherein the spare row decoder 14 can select a spare row line 12.

The control section 23 controls the sense amplifier 16, the data inputting section 17 and the input/output buffer 18, thereby to control reading/programming of data and also control the pre-program operation.

Figure 2:
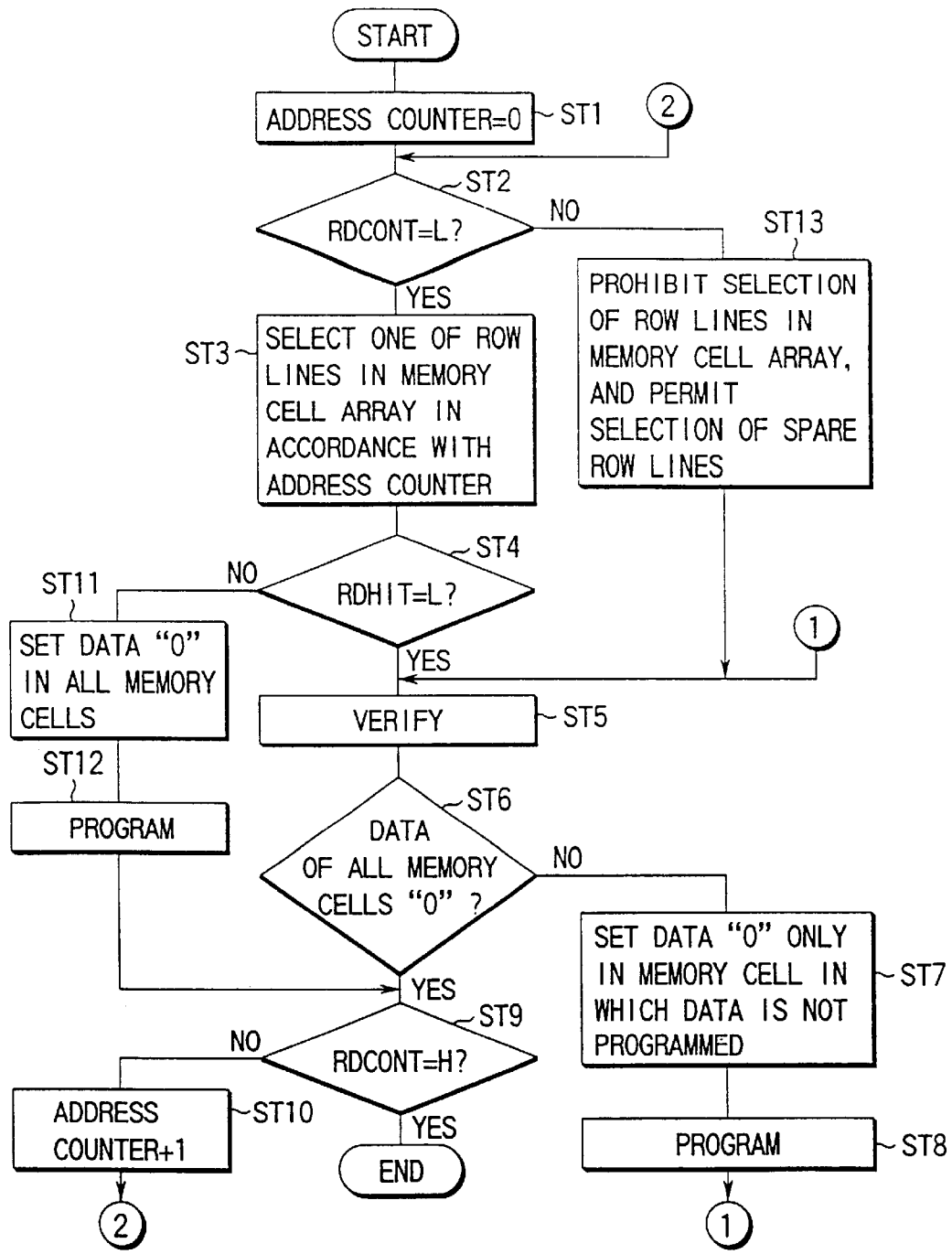
FIG. 2 is a flow chart of a pre-program operation (program operation prior to data erasure) which is performed in the non-volatile semiconductor memory device.

The pre-program operation performed with the above structure will be explained with reference to FIG. 2.

When the pre-program operation is performed, the replacement prohibiting signal RDDIS supplied to the row decoder 13 is set at a high level, thereby prohibiting a spare row line 12 from being used instead of the row line connected to the defective memory cell, i.e., instead of the defective row line.

More specifically, first of all, the address counter 19 and the binary counter 22 are reset, whereby the count value of the address counter 19 is set at 0 (ST1). Thus, the signal RDCONT falls to a low level "L". In this state, the row lines of the memory cell array 11 are successively designated by the row decoder 13 by incrementing the count value of the address counter, and the verify operation and the program operation of data are performed (ST2 to ST10). To be more specific, when a normal row line, i.e., a non-defective row line is selected, the data of each of the memory cells connected to the non-defective row line is verified (ST5, ST6). As a result, when the threshold voltage of one of the memory cells is lower than a predetermined voltage, data "0" is programmed only in the memory cell (ST7, ST8). Then, the data of the cell is re-verified (ST5, ST6), and when it is verified that the threshold voltage is not sufficiently increased, the steps ST7, ST8, ST5 and ST6 are repeated. On the other hand, when it is verified that the threshold voltage is sufficiently increased, it is then determined whether or not the signal RDCONT rises to a high level, i.e., whether or not a row line to be now selected is the last one of the row lines (ST9). As a result, when it is determined that it is not the last one of the row lines, the count value of the address counter 19 is increased (ST10), and the steps ST2 to ST10 are repeated.

While the above steps are being carried out, when the address produced by the address counter 19 is identical to the address of the defective row line, i.e., defective row address, which is stored in the defective row address storing section 21, the replacement signal RDHIT outputted from the defective row address storing section 21 rises to the high level (ST4). In this case, data "0" is programmed in all the memory cells of the defective row line, without performing the verify operation (ST11, ST12).

As mentioned above, data is successively programmed in the memory cells in units of one row line in the memory cell array 11 by increasing the count value of the address counter 19. When the row line to be selected is the last one of the row lines, the count value of the binary counter 22 is incremented by carry of the address counter 19. Thus, the signal RDCONT outputted from the counter 22 rises to a high level "H". In this state, control is shifted from the step ST2 to the step ST13, and the memory cell array 11 are forcibly made to enter a non-selection state wherein the memory cell array 11 are prohibited from being selected, and a spare row line 12 is selected by the spare row decoder 14. In this case, first of all, the data of memory cells connected to the spare row line 12 is verified (ST5, ST6). As a result, when it is verified that of those memory cells, the threshold voltage of a memory cell (or cells) is lower than a predetermined voltage, data "0" is programmed in the memory cell only (ST7, ST8). Thereafter, the data of the memory cell is re-verified (ST5, ST6), and when it is verified that the threshold voltage is not sufficiently increased, the steps ST7, ST8, ST5 and ST6 are repeated. In contrast, when the threshold value is sufficiently increased, the signal RDCONT rises to a high level, and thus the pre-program operation is ended.

According to the above embodiment, the row lines of the memory cell array 11 are successively selected in accordance with the address produced by the address counter 19. When the selected row line is normal (non-defective), the program operation is performed on the memory cell after the data is verified. In contrast, when the selected row line is defective, the program operation is performed on the memory cell of the defective row line without verifying the data. When the pre-program operation has been completely performed on the memory cells of all the row lines of the memory cell array 11, the output signal RDCONT of the binary counter 22 connected to the most significant bit portion of the address counter 19 rises to the high level, and as a result, the memory cell array 11 is forcibly made to enter the non-selection state (it is prohibited from being selected), and the spare row lines 12 are forcibly made to enter the selection state (selection of the spare row lines is permitted). When a spare row line 12 is forcibly selected, the verify operation and the program operation are performed on memory cells connected to the selected spare row line 12. However, unlike the conventional memory device, the memory device of the present invention, as is clear from the above, does not need to read out the address of the defective row line connected to a defective memory cell, in order to select a spare row line 12. Nor does it feed back the address to the address buffer. Therefore, the circuit structure of the defective row address storing section and the layout of structural elements thereof are not complicated.

Furthermore, it is possible to effect switching between the program operation accompanied by the verify operation and the program operation not accompanied by the verify operation, simply by supplying the coincidence signal RDHIT. Thus, a sequential operation for control is simple.

Figure 3:
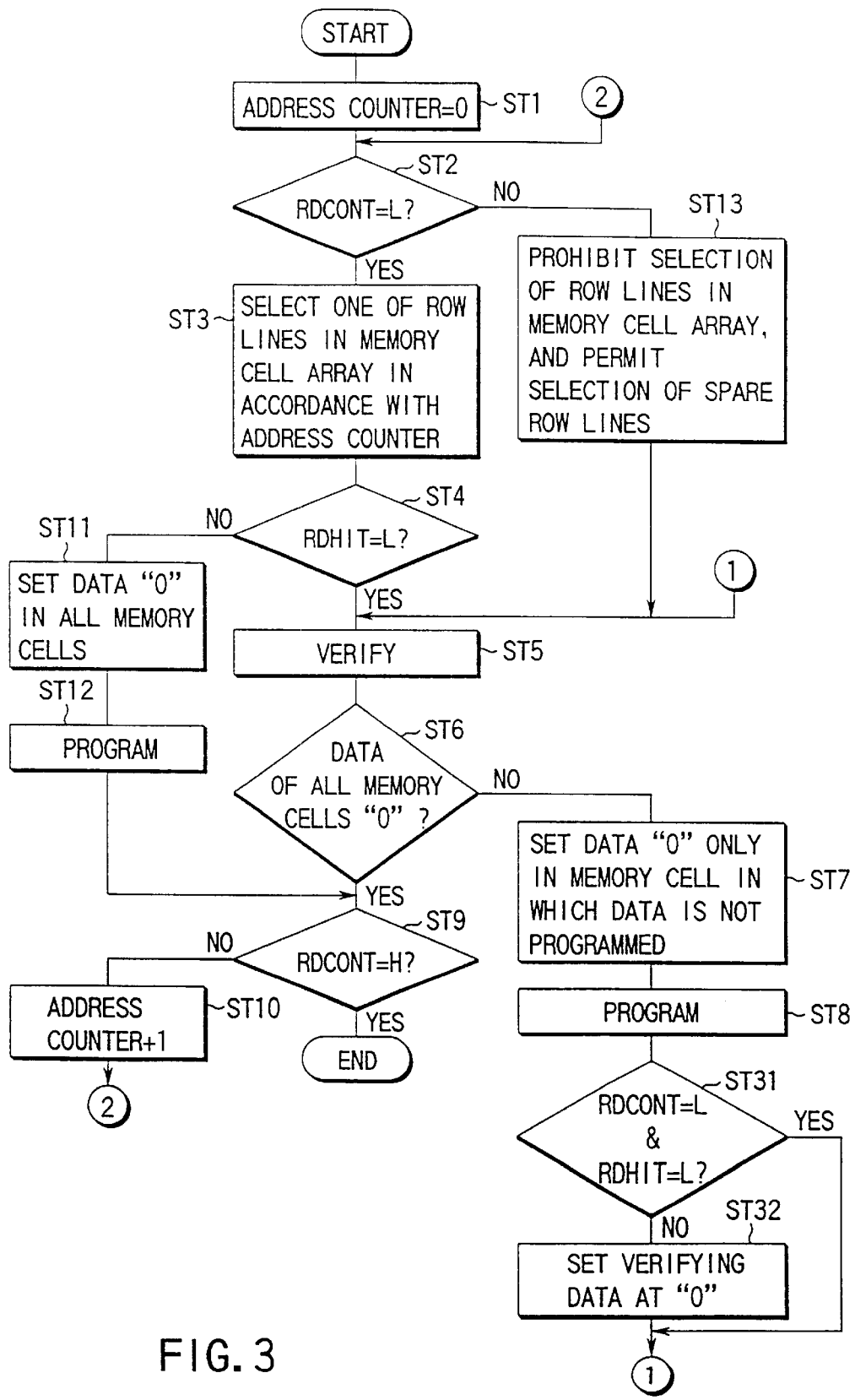
FIG. 3 is a flow chart of a modification of the pre-program operation shown in FIG. 2.

FIG. 3 shows a modification of the pre-program operation. With respect to the modification, structural or functional elements identical to those in FIG. 2 will be denoted by the same reference numerals, and their detailed explanations will be omitted.

In the modification shown in FIG. 3, in the case where the verify operation and the program operation are performed, it is determined whether or not both the levels of the signal RDCONT and coincidence signal RDHIT are low, after the program operation is performed (ST8). All verify data is set at "0", in any case except for the case where both the levels of the above signals are low. To be more specific, in the case where a spare row line 12 is selected, all the verify data is set at "0". In this state, the verify operation is performed, and thus the sequential operation for control is simplified.

Figure 4:
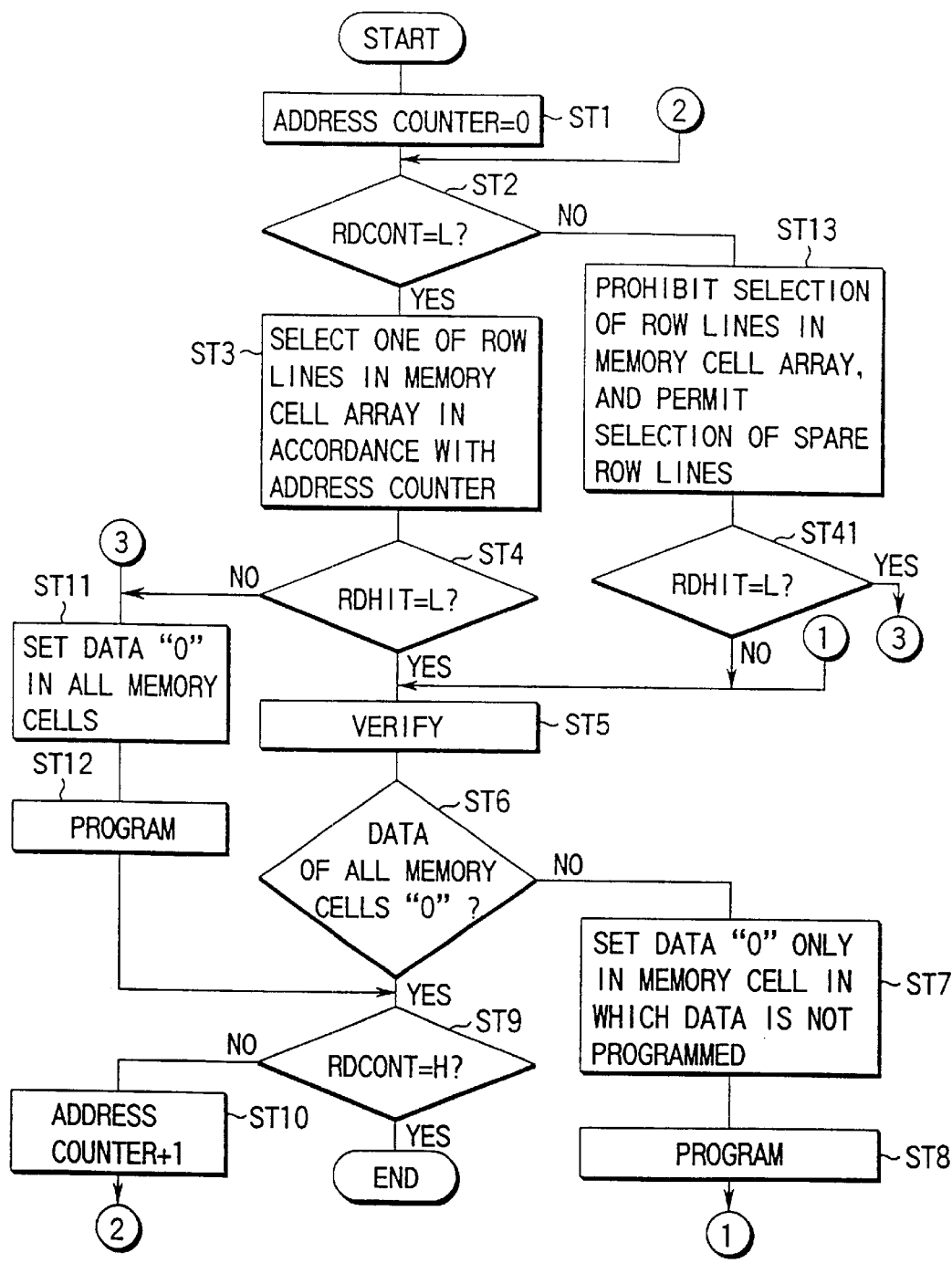
FIG. 4 is a flow chart of another modification of the pre-program operation shown in FIG. 2.

FIG. 4 shows another modification of the preprogram operation. With respect to the other modification, structural or functional elements identical to those in FIG. 2 will be denoted by the same reference numerals, and their detailed explanations will be omitted.

In the other modification, when the signal RDCONT rises to the high level, and a spare row line 12 is selected (ST2, ST13), it is determined whether or not the level of the coincidence signal RDHIT is low (ST41). As a result, when it is determined that the level is low, i.e., when it is determined that the selected spare row line 12 is unused, data is set at "0", and ie; programmed in all the memory cells connected to the spare row line 12.

On the other hand, when the level of the coincidence signal RDHIT is high, the verify operation and the program operation are performed (ST5 to ST8).

Moreover, in the other modification shown in FIG. 4, when the selected spare row line 12 is unused, the program operation is performed without performing the verify operation. Therefore, even if the above unused spare row line 12 is defective, the pre-program operation can be performed.

Figure 5:
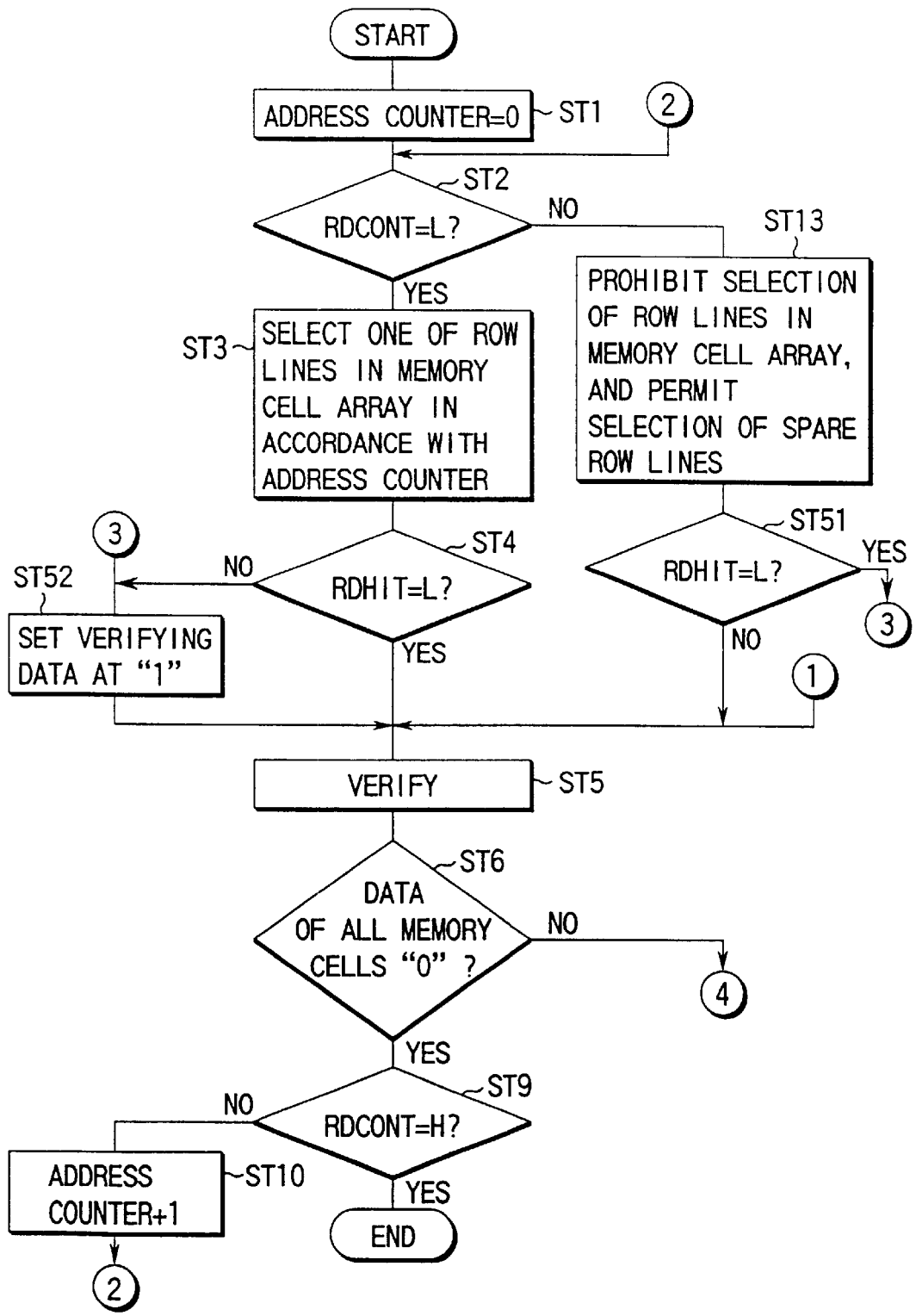
FIG. 5 is a flow chart of a further modification of the pre-program operation shown in FIG. 2.
Figure 6:
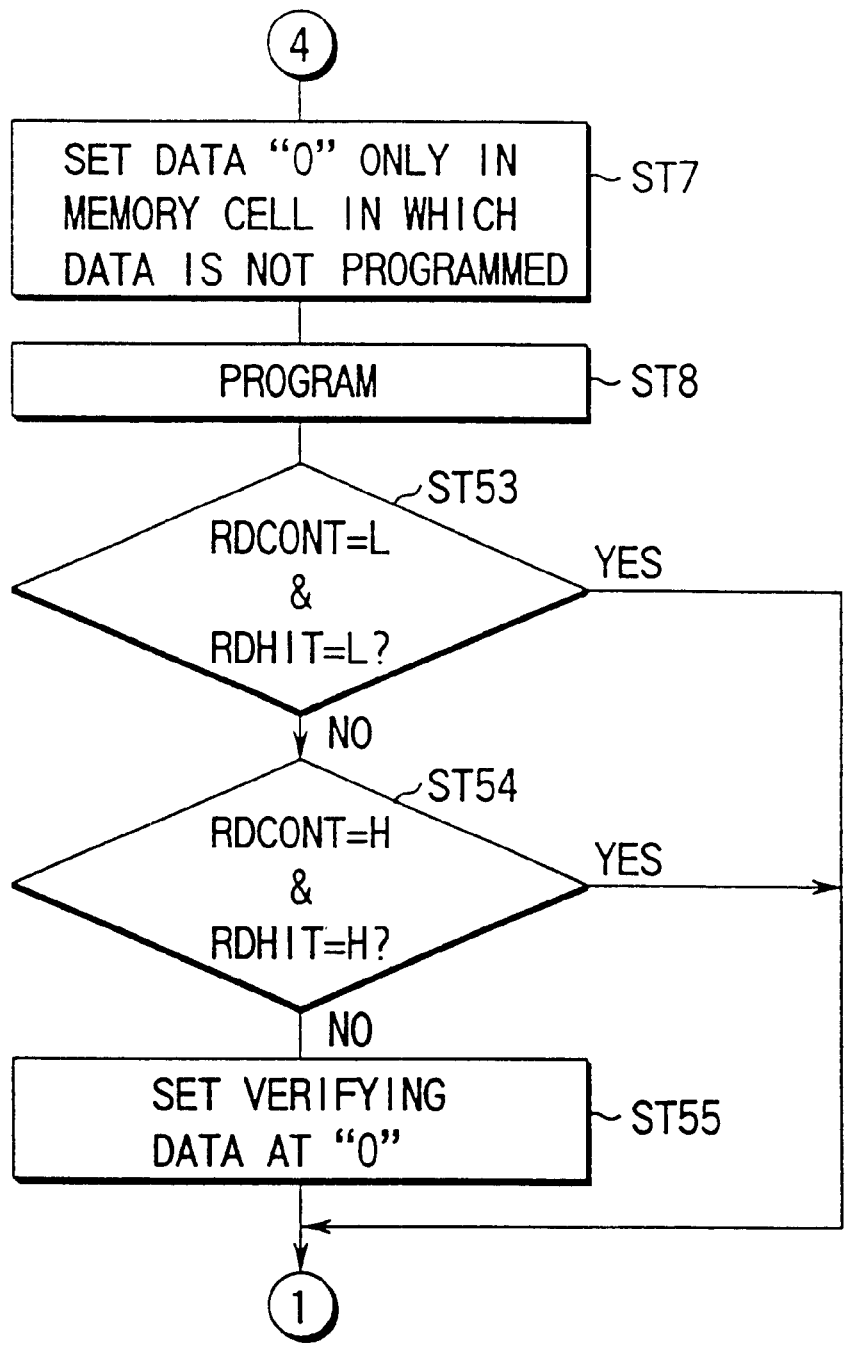
FIG. 6 is a flow chart subsequent to the flow chart of FIG. 5.
Figure 7:
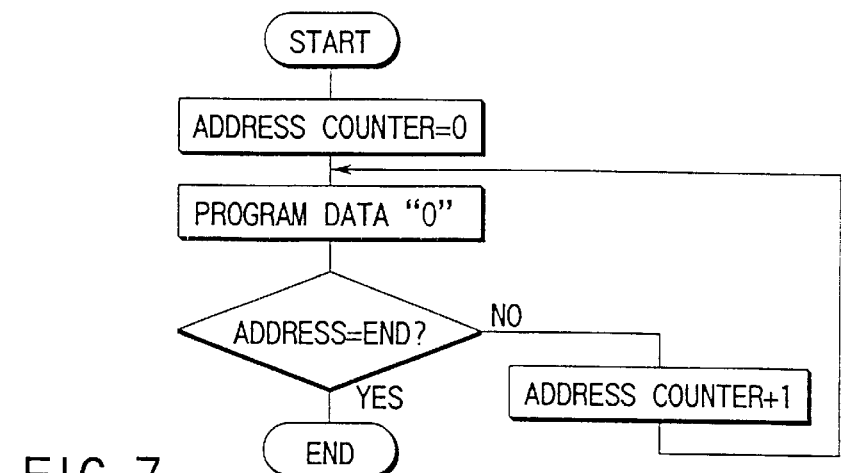
FIG. 7 is a flow chart of a conventional preprogram operation of a non-volatile semiconductor memory devices
Figure 8:
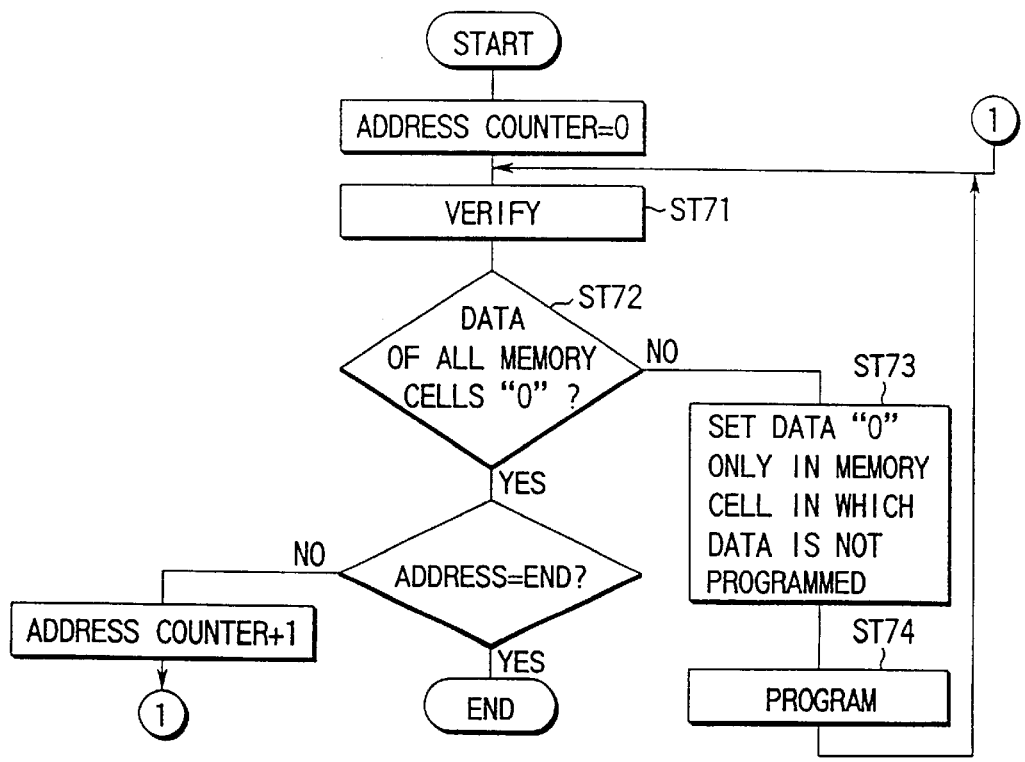
FIG. 8 is a flow chart of a conventional preprogram operation of a non-volatile semiconductor memory device.
Figures 10A, 10B:
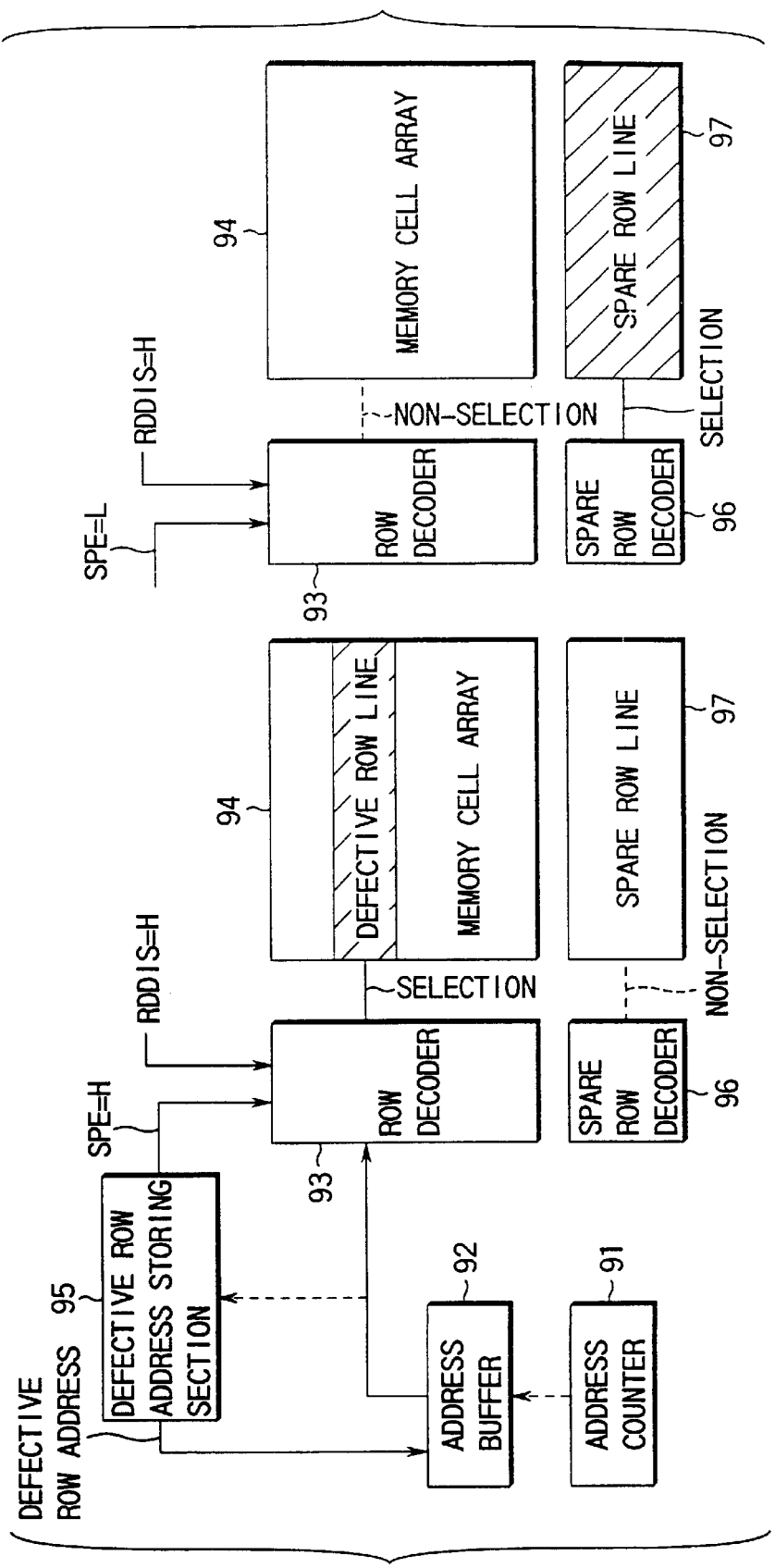
FIG. 10A is a schematic block diagram for illustrating the conventional pre-program operation of a non-volatile semiconductor memory device.
FIG. 10B is another schematic block diagram for illustrating the conventional pre-program operation of a non-volatile semiconductor memory device.
Figure 11:
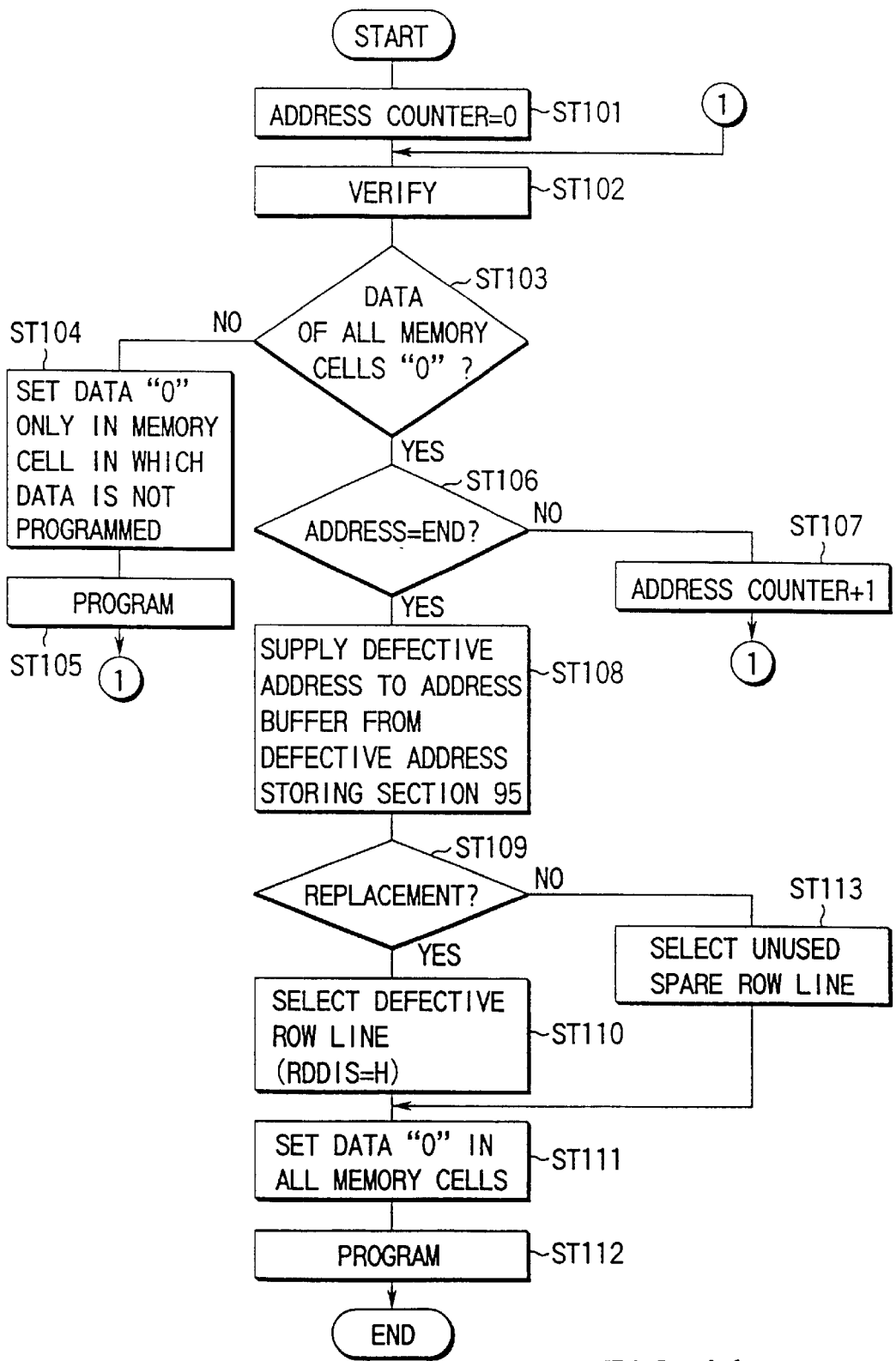
FIG. 11 is a flow chart of the conventional preprogram operation of a non-volatile semiconductor memory device.
Figure 12:
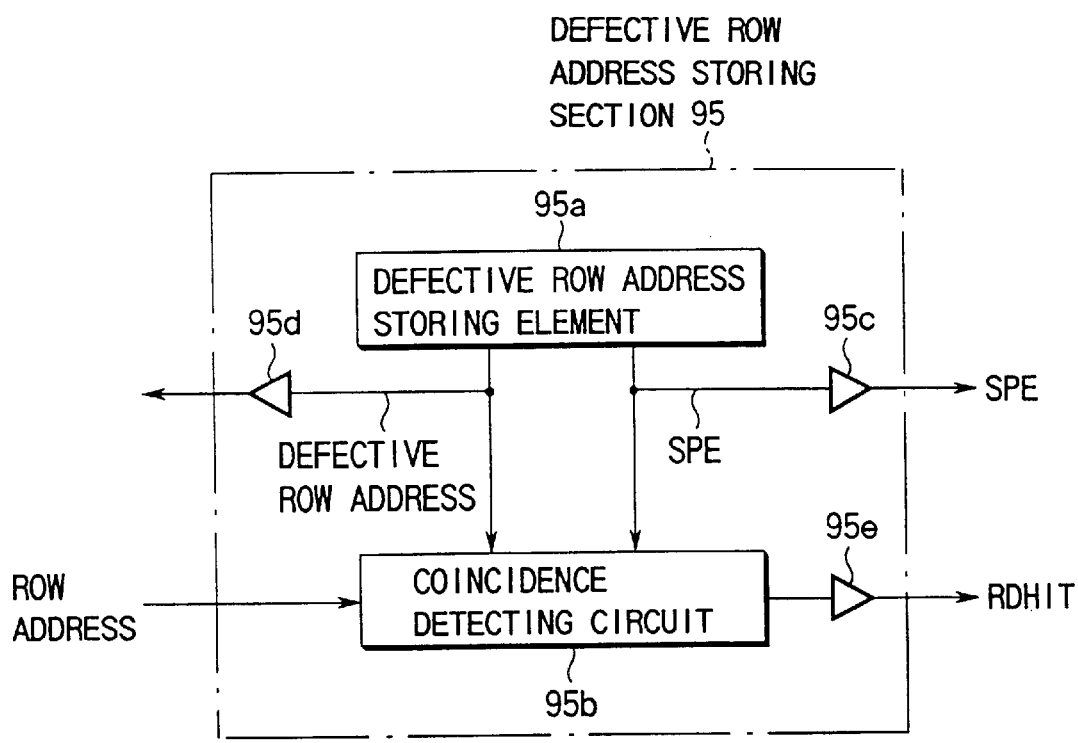
FIG. 12 is a block diagram of a conventional defective row address storing section of a non-volatile semiconductor memory device.

FIGS. 5 and 6 shows a further modification of the pre-program operation. With respect to the further embodiment, structural elements identical to those in FIG. 2 will be denoted by the same reference numerals, and their detailed explanations will be omitted.

As shown in FIG. 5, when the level of the signal RDCONT is high, and a spare row line 12 is selected (ST3, ST13), it is determined whether or not the level of the coincidence signal RDHIT is low (ST51). As a result, when it is determined that the level is low, i.e., the selected spare row line 12 is unused, all verify data is set at "1" (ST52). Thereafter, when it is determined that the level of the coincident signal RDHIT is high, the verify operation and the program operation are performed (ST5 to ST8).

On the other hand, in the above step ST51, when it is determined that the level of the coincident signal RDHIT is high, the verify operation and the program operation are performed as shown in FIGS. 5 and 6 (ST5 to ST8). Thereafter, in the steps ST53 and 54, it is determined whether or the selected spare row line is defective or unused. To be more specific, first of all, it is determined whether or not a condition is satisfied, in which both the levels of the signal RDCONT and coincident signal RDHIT are low (ST53). As a result, when it is determined that the condition is not satisfied, it is determined whether or not a condition is satisfied, in which both the levels of the signal RDCONT and coincident signal RDHIT are high (ST54). Thereafter, when it is determined that the former condition is not satisfied, and it is determined that the latter condition is not satisfied, the verify data is set at "0" (ST55), and the verify operation is performed (ST5).

In the above further modification, even if the above unused spare row line 12 is defective, the verify operation and the program operation are prevented from not finishing.

In the above embodiment of the present invention, the binary counter 22 and the address counter 19 are provided separate from each other. However, they may be formed as a single unit.

The number of bits of the binary counter 22 is determined in accordance with the number of spare row lines. To be more specific, the counter circuit 24 including the binary counter 22 has only to have a structure for successively signals for use in the row lines of the memory cell array and the spare row lines, respectively, at the pre-program operation.

In addition, the present invention is not limited to the above embodiments. Needless to say, various modifications can be applied within the scope of the present invention.

As explained in detail above, according to the present invention, a non-volatile semiconductor memory device can be provided, in which the circuit structure and the layout of structural elements are not complicated, and control of the pre-program operation is simple.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A non-volatile semiconductor memory device comprising:

a memory cell array having a plurality of memory cells arranged in a form of rows and columns;

spare cells each for replacing a defective one of the memory cells of the memory cell array;

a sense amplifier for reading information stored in the memory cells of the memory cell array;

an input/output buffer for controlling input/output of data;

a data input section and a data writing circuit for controlling writing data;

a counter circuit for generating signals for successive selection of addresses of the memory cells of the memory cell array at pre-program operation;

an address buffer for successively selecting the memory cells in response to the signals generated by the counter circuit;

a main decoder for decoding addresses outputted from the address buffer;

a defective cell address storing circuit for storing addresses of the defective memory cells of the memory cell array, and for generating a coincidence signal when an address of one of the memory cells selected by the signals generated by the counter circuit is identical to one of the addresses stored in the defective cell address storing circuit;

a spare decoder for selecting the spare cells which are to replace the defective cells of the memory cell array;

a signal generating circuit for generating a control signal for allowing selection of the spare cells and prohibiting selection of the memory cell array, after the counter circuit generates a signal for selecting a last one of the memory cells of the memory cell array; and a control circuit for controlling the data input section and the data writing circuit in such a manner that programming of data is first performed on the memory cells of the memory cell array and programming of data is thereafter performed on the spare cells, in response to the signal generated by the counter circuit at the pre-program operation, the control signal outputted from the signal generating circuit, and the coincidence signal outputted from the defective cell address storing circuit.

2. The non-volatile semiconductor memory device according to claim 1, wherein the main decoder is composed of a row decoder for selecting one of the rows of the memory cell array in accordance with a respective one of the addresses designated by the address buffer, and the spare decoder selects the spare cells in a row which are to replace the defective cells in a row of the memory cell array.

3. The non-volatile semiconductor memory device according to claim 2, wherein the signal generating circuit comprises a binary counter connected to a high order bit portion of the counter circuit.

4. The non-volatile semiconductor memory device according to claim 2, wherein the control circuit verifies data of those memory cells of the memory cells connected to the rows of the memory cell array which are non-defective and then programs data in the non-defective memory cells when verifying that data programming of the non-defective memory cells is insufficient, in response to the control signal outputted from the signal generating circuit and the coincidence signal outputted from the defective cell address storing circuit, the control circuit programs data in the memory cells connected to the defective rows without verifying data of the memory cells connected to the defective rows, in response to the control signal outputted from the signal generating circuit and the coincidence signal outputted from the defective cell address storing circuit, and the control circuit programs data in the memory cells connected to the spare rows, without verifying data of the memory cells connected to the spare rows, in response to the control signal outputted from the signal generating circuit and the coincidence signal outputted from the defective cell address storing circuit.

5. The non-volatile semiconductor memory device according to claim 2, wherein the control circuit verifies data of those memory cells of the memory cells connected to the rows of the memory cell array which are non-defective and then programs data in the non-defective memory cells when verifying that data programming of the non-defective memory cells is insufficient, in response to the control signal outputted from the signal generating circuit and the coincidence signal outputted from the defective cell address storing circuit, the control circuit programs data in the memory cells connected to the defective rows without verifying data of the memory cells connected to the defective rows, in response to the control signal outputted from the signal generating circuit and the coincidence signal outputted from the defective cell address storing circuit, and the control circuit programs data in the memory cells connected to the spare rows, while verifying data of the memory cells connected to the spare rows, in response to the control signal outputted from the signal generating circuit and the coincidence signal outputted from the defective cell address storing circuit.

6. The non-volatile semiconductor memory device according to claim 2, wherein in a case where the control circuit performs a verify operation for verifying data of the memory cells of the defective rows, and a program operation for programming data in the memory cells of the defective rows, the control circuit sets all verify data at "1" when performing the verify operation for a first time, and sets all the verify data at "0" when performing the verify operation for a second time.

7. The non-volatile semiconductor memory device according to claim 2, wherein the control circuit programs data "0" in the memory cells of the defective rows without verifying data of the memory cells of the defective rows.

8. The non-volatile semiconductor memory device according to claim 2, wherein in a case where the control circuit performs a verify operation for verifying data of the memory cells connected to the spare rows, and a program operation for programming data in the memory cells connected to the spare rows, if the spare rows are unused, the control circuit sets all verify data at "1" when performing the verify operation for a first time, and sets all the verify data at "0" when performing the verify operation for a second time.

9. The non-volatile semiconductor memory device according to claim 2, wherein in a case where the control circuit performs a program operation for programming data in the memory cells connected to the spare rows, if the spare rows are unused, the control circuit programs data "0" in the memory cells connected to the spare rows without verifying data of the memory cells connected to the spare rows.

10. The non-volatile semiconductor memory device according to claim 2, wherein in a pre-program operation in which the program operation prior to data erasure is performed, the control circuit prohibits any of the spare rows from being used instead of the defective rows.

11. The non-volatile semiconductor memory device according to claim 2, wherein the main decoder is composed of a y-decoder for selecting one the columns of the memory cell array in accordance with a respective one of the addresses designated by the address buffer, and the spare decoder selects the spare cells in a column which are to replace the defective cells in a column of the memory cell array.

12. The non-volatile semiconductor memory device according to claim 11, wherein the signal generating circuit comprises a binary counter connected to a high order bit portion of the counter circuit.

13. The non-volatile semiconductor memory device according to claim 11, wherein the control circuit verifies data of those memory cells of the memory cells connected to the columns of the memory cell array which are non-defective and then programs data in the non-defective memory cells when verifying that data programming of the non-defective memory cells is insufficient, in response to the control signal outputted from the signal generating circuit and the coincidence signal outputted from the defective cell address storing circuit, the control circuit programs data in the memory cells connected to the defective columns without verifying data of the memory cells connected to the defective columns, in response to the control signal outputted from the signal generating circuit and the coincidence signal outputted from the defective cell address storing circuit, and the control circuit programs data in the memory cells connected to the spare columns, without verifying data of the memory cells connected to the spare column, in response to the control signal outputted from the signal generating circuit and the coincidence signal outputted from the defective cell address storing circuit.

14. The non-volatile semiconductor memory device according to claim 11, wherein the control circuit verifies data of those memory cells of the memory cells connected to the columns of the memory cell array which are non-defective and then programs data in the non-defective memory cells when verifying that data programming of the non-defective memory cells is insufficient, in response to the control signal outputted from the signal generating circuit and the coincidence signal outputted from the defective cell address storing circuit, the control circuit programs data in the memory cells connected to the defective columns without verifying data of the memory cells connected to the defective columns, in response to the control signal outputted from the signal generating circuit and the coincidence signal outputted from the defective cell address storing circuit, and the control circuit programs data in the memory cells connected to the spare columns, while verifying data of the memory cells connected to the spare columns, in response to the control signal outputted from the signal generating circuit and the coincidence signal outputted from the defective cell address storing circuit.

15. The non-volatile semiconductor memory device according to claim 11, wherein in a case where the control circuit performs a verify operation for verifying data of the memory cells of the defective columns, and a program operation for programming data in the memory cells of the defective columns, the control circuit sets all verify data at "1" when performing the verify operation for a first time, and sets all the verify data at "0" when performing the verify operation for a second time.

16. The non-volatile semiconductor memory device according to claim wherein the control circuit programs data "0" in the memory cells of the defective columns without verifying data of the memory cells of the defective columns.

17. The non-volatile semiconductor memory device according to claim 11, wherein in a case where the control circuit performs a verify operation for verifying data of the memory cells connected to the spare columns, and a program operation for programming data in the memory cells connected to the spare columns, if the spare columns is unused, the control circuit sets all verify data at "1" when performing the verify operation for a first time, and sets all the verify data at "0" when performing the verify operation for a second time.

18. The non-volatile semiconductor memory device according to claim 11, wherein in a case where the control circuit performs a program operation for programming data in the memory cells connected to the spare columns, if the spare columns are unused, the control circuit programs data "0" in the memory cells connected to the spare columns without verifying data of the memory cells connected to the spare columns.

19. The non-volatile semiconductor memory device according to claim 11, wherein in a pre-program operation in which the program operation prior to data erasure is performed, the control circuit prohibits any of the spare columns from being used instead of the defective columns.

* * * * *